United States Patent
Kim (10) Patent No.: US 7,324,032 B2
(45) Date of Patent: Jan. 29, 2008

(54) METHOD OF MATCHING DYNAMIC ELEMENTS AND MULTI-BIT DATA CONVERTER

(75) Inventor: Sang-Ho Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/502,664

(22) Filed: Aug. 10, 2006

(65) Prior Publication Data

US 2007/0040720 A1 Feb. 22, 2007

(30) Foreign Application Priority Data

Aug. 20, 2005 (KR) .................. 10-2005-0076549

(51) Int. Cl.
*H03M 1/66* (2006.01)
(52) U.S. Cl. ...................................... 341/144; 341/145
(58) Field of Classification Search ................ 341/144, 341/143, 145, 150
See application file for complete search history.

(56) References Cited

U.S. PATENT DOCUMENTS

| | | | |
|---|---|---|---|
| 5,406,283 A * | 4/1995 | Leung | ........................ 341/143 |
| 5,990,819 A | 11/1999 | Fujimori | |
| 6,535,155 B2 | 3/2003 | Ruha et al. | |
| 6,864,819 B2 | 3/2005 | Wang | |
| 2002/0105453 A1 * | 8/2002 | Fujimori et al. | ............ 341/144 |

FOREIGN PATENT DOCUMENTS

KR 2004-104656 12/2004

OTHER PUBLICATIONS

Rex T. Baird and Terri S. Fiez, "Linearity Enhancement of Multibit ΔΣ A/D and D/A Converters Using Data Weighted Averaging," IEEE Transactions on Circuits and Systems-II: Analog and Digital Signal Processing, vol. 42, No. 12, Dec. 1995, pp. 753-762.

* cited by examiner

*Primary Examiner*—Rexford Barnie
*Assistant Examiner*—Joseph Lauture
(74) *Attorney, Agent, or Firm*—F. Chau & Assoc., LLC (57) ABSTRACT

A method of matching dynamic elements includes sequentially selecting first unit elements corresponding to a value of first digital data among M unit elements in a first direction, the M unit elements being for converting sequentially inputted digital data to an analog signal; checking whether a reference unit element is selected; checking a value of a LSB of the first digital data when the reference unit element is selected; sequentially selecting second unit elements corresponding to a value of second digital data inputted next to the first digital data among the M unit elements in a second direction opposite to the first direction when the value of the LSB of the first digital data is a first value; and sequentially selecting the second unit elements in the first direction when the value of the LSB of the first digital data is a second value.

27 Claims, 8 Drawing Sheets

METHOD OF MATCHING DYNAMIC ELEMENTS AND MULTI-BIT DATA CONVERTER

CROSS-REFERENCE TO RELATED APPLICATIONS

This application claims priority under 35 USC § 119 to Korean Patent Application No. 2005-76549, filed on Aug. 20, 2005, the entire contents of which are herein incorporated by reference.

BACKGROUND OF THE INVENTION

1. Technical Field

The present disclosure relates to a method of matching dynamic elements and multi-bit data converters and, more particularly, to a method of matching dynamic elements and multi-bit data converters capable of solving an in-band tone problem caused by a repeated selection of a unit element during a conversion of multi-bit data.

2. Discussion of the Related Art

Techniques for implementing a mixed-mode signal processing (MMSP) integrated circuit (IC) on a single chip are being developed. MMSP includes processing of both analog and digital signals. Also, data converters, for example, an analog-to-digital converter (ADC) and a digital-to-analog converter (DAC), are required to have a high resolution.

Different types of data converters include, for example, a Nyquist-based data converter that applies a sampling technique using a Nyquist rate, and an oversampling data converter that applies an oversampling technique.

The Nyquist-based data converter may operate at high speed because the converter samples an input signal with the Nyquist rate. A high resolution is difficult to achieve in the Nyquist-based data converter, however, because the Nyquist-based data converter needs an analog passive element having a high precision and is vulnerable to noise or signal interference.

Therefore, the oversampling data converter is generally used for data conversion of a high resolution. The oversampling data converter needs high-speed operation and complicated digital signal processing since the oversampling data converter uses a high sampling frequency. The digital signal processing may be implemented in the oversampling data converter, however, by using an analog element that needs comparatively less accuracy.

Among the different types of oversampling data converters, a delta-sigma data converter that performs noise shaping in a signal band is widely used for signal processing in an audio signal band that requires a high resolution due to a narrow frequency range thereof.

Figure 1:
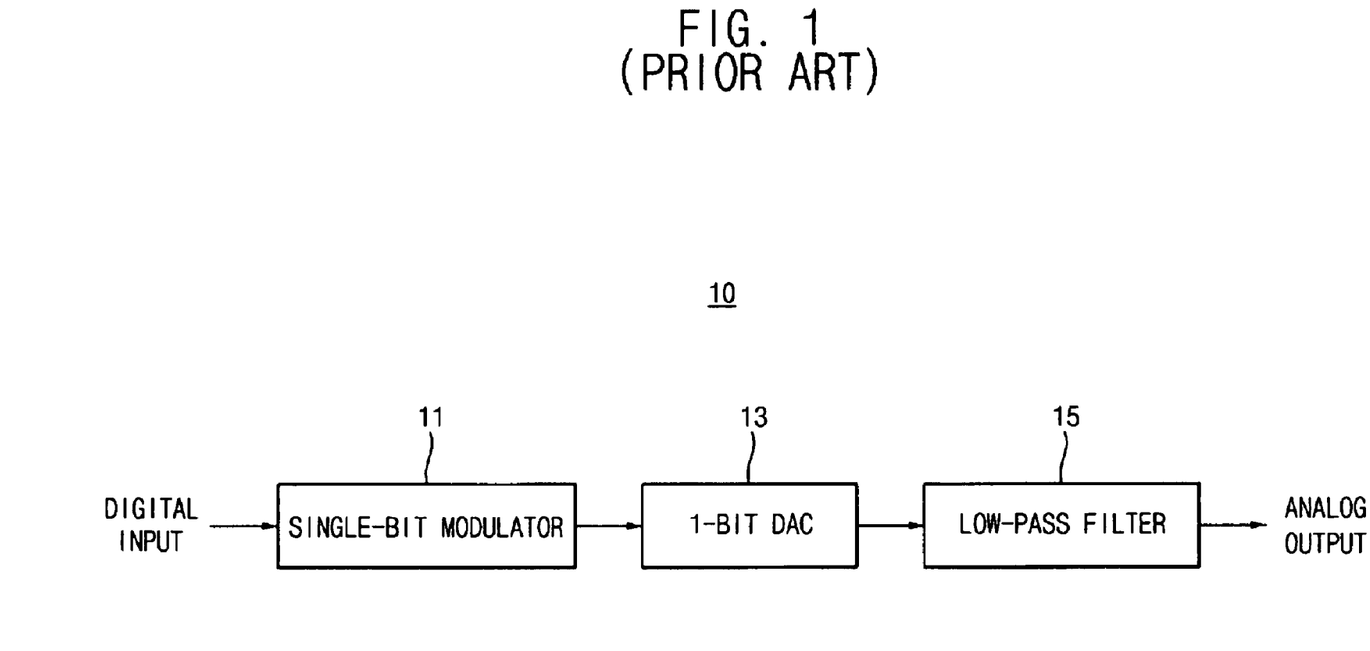
FIG. 1 is a block diagram illustrating a conventional delta-sigma data converter having a single-bit modulator.

FIG. 1 is a block diagram illustrating a conventional delta-sigma data converter having a single-bit modulator.

Referring to FIG. 1, the delta-sigma data converter 10 includes a single-bit modulator 11, a 1-bit digital-to-analog converter (DAC) 13 and a low-pass filter 15.

When digital data is inputted to the single-bit modulator 11, the single-bit modulator 11 converts the inputted digital data into a 1-bit sigma-delta signal, and then outputs the converted signal. The outputted 1-bit sigma-delta signal is converted into a continuous time signal through the 1-bit DAC 13. The low-pass filter 15 performs filtering of the continuous time signal, which is outputted from the 1-bit DAC 13 and passes a necessary band to output an analog signal.

Because the delta-sigma data converter 10 includes the single-bit modulator 11 that performs a quantization using only two steps, the linearity of the conversion process is guaranteed. A high-degree modulator for a high resolution, however, may cause a problem of low stability.

Therefore, a multi-bit modulator is typically used in the delta-sigma data converter so as to solve the problem of low stability. The multi-bit modulator has enhanced stability compared with the single-bit modulator. Thus, the multi-bit modulator may have a high signal-to-noise ratio (SNR) with a relatively low oversampling ratio (OSR).

The delta-sigma data converter using the multi-bit modulator requires a multi-bit DAC. In this case, the delta-sigma data converter may have a problem related to a mismatch between unit elements in the DAC.

Each bit of a digital input code is converted to an analog signal by switching a corresponding analog unit element, such as a capacitor, and then the converted analog signals are summed and outputted. Fluctuations between the respective unit elements, that is, a mismatch error, may cause a nonlinearity of the digital-to-analog conversion.

A linear error in an analog to digital converter (ADC) may be pushed out of the signal band by noise shaping. The linear error in the DAC, however, degrades efficiency of the whole system, because the linear error is located at the same position as the signal from the aspect of the transmission function of the whole system.

Therefore, research on dynamic element matching (DEM) is being conducted in an effort to solve the problem of mismatch errors between unit elements in the converter. For example, use of the DEM technique is disclosed in U.S. Pat. No. 5,990,819, entitled "D/A converter and delta-sigma D/A converter."

According to the above DEM technique, the mismatch error between elements may be converted into white noise in the frequency domain by randomly selecting unit elements according to each DAC operation.

In addition, by using a recurring algorithm, such as a data weight averaging (DWA) technique that selects at least one unit element based on an inputted digital signal so as to average the mismatch errors between unit elements, noise shaping of the noise caused by the mismatch error in the signal band may be accomplished.

Fundamental techniques of the DWA technique are disclosed, for example, in a publication by Rex T. Baird and Terry S. Fiez, entitled "Linearity enhancement of multibit $\Delta\Sigma$ A/D and D/A converters using data weighted averaging, IEEE Transactions on Circuits and Systems II: Analog and Digital Signal Processing, Vol. 42, No. 12, December 1995."

The conventional DWA algorithm, however, selects unit elements in sequential order or by simply changing the order of selection based on an inputted digital signal and may cause an in-band tone problem when a specific signal is repeatedly inputted.

In the recurring algorithm, such as the DWA, a mismatch error of the DAC is converted into broadband noise. Periodic signal elements, that is, tones, however, are generated at a specific frequency.

The generation of the tones is not desirable, because the tones have a tendency to reduce the dynamic range of the system. The generated tones demodulate noise that is outside of a desired signal band and interrupt signals within the desired signal band. Although the tones cause little noise, the noise may still be audible in the case of an audio converter. More particularly, the smaller the size of the inputted digital data, the more serious the problem of the in-band tone becomes.

SUMMARY OF THE INVENTION

Exemplary embodiments of the present invention are provided to substantially obviate one or more problems due to limitations and disadvantages of the related art.

Exemplary embodiments of the present invention provide a method of matching dynamic elements capable of removing an in-band tone caused by a repeated selection of a unit element, using a data weight averaging (DWA) algorithm.

Exemplary embodiments of the present invention also provide a multi-bit data converter capable of removing an in-band tone caused by a repeated selection of a unit element.

In exemplary embodiments of the present invention, a method of matching dynamic elements includes: sequentially selecting at least one first unit element corresponding to a value of first digital data among M unit elements in a first direction, the M unit elements being used for converting sequentially inputted digital data to an analog signal; checking whether a reference unit element is selected; checking a value of a least significant bit (LSB) of the first digital data when the reference unit element is selected; sequentially selecting at least one second unit element corresponding to a value of second digital data among the M unit elements in a second direction when the value of the LSB of the first digital data is a first value, the second direction being opposite to the first direction, the second digital data being inputted next to the first digital data; and sequentially selecting the at least one second unit element in the first direction when the value of the LSB of the first digital data is a second value.

The exemplary method may further include sequentially selecting the at least one second unit element in the first direction when the reference unit element is not selected.

The first direction may be a right direction and the second direction may be a left direction. The reference unit element may be the unit element that is located in a central portion among the M unit elements. The first value may be an odd number and the second value may be an even number.

In exemplary embodiments of the present invention, a method of matching dynamic elements includes sequentially selecting at least one first unit element corresponding to a value of first digital data among M unit elements in a first direction, the M unit elements being for converting sequentially inputted digital data to an analog signal; checking whether a reference unit element is selected; checking a value of a least significant bit (LSB) of the first digital data when the reference unit element is selected; comparing a value of the digital data with a reference data value when the value of the LSB of the first digital data is a first value; sequentially selecting at least one second unit element corresponding to a value of second digital data in a second direction when the value of the first digital data is not larger than the reference data value, the second direction being opposite to the first direction, the second digital data being inputted next to the first digital data; and sequentially selecting the at least one second unit element in the first direction when the value of the first digital data is larger than the reference data value. The reference data value may be about half of a maximum value of the sequentially inputted digital data.

The exemplary method may further include sequentially selecting the at least one second unit element in the first direction when the reference unit element is not selected. The exemplary method may further include sequentially selecting the at least one second unit element in the first direction when the value of the LSB of the first digital data is a second value.

In exemplary embodiments of the present invention, a method of matching dynamic elements includes: sequentially selecting at least one first unit element corresponding to a value of first digital data among M unit elements in a first direction, the M unit elements being used for converting sequentially inputted digital data to an analog signal; checking whether t a reference unit element is selected; checking a value of a least significant bit (LSB) of the first digital data when the reference unit element is selected; sequentially selecting at least one second unit element corresponding to a value of second digital data in the first direction by shifting a start point for selecting the at least one second unit element by a number J when the value of the LSB of the first digital data is a first value, the at least one second unit element being selected starting from the unit element that is shifted by the number J from the unit element last selected by the first digital data; and sequentially selecting the at least one second unit element without shifting the start point for selecting the at least one second unit element when the value of the LSB of the first digital data is a second value.

Sequentially selecting the at least one second unit element by shifting the start point may include the steps of: comparing the value of the first digital data with a reference data value when the value of the LSB of the first digital data is the first value; sequentially selecting the at least one second unit element by shifting the start point for selecting the at least one second unit element by the number J when the value of the first digital data is not larger than the reference data value; and sequentially selecting the at least one second unit element without shifting the start point for selecting the at least one second unit element when the value of the first digital data is larger than the reference data value.

In exemplary embodiments of the present invention, a multi-bit data converter includes: a plurality of unit elements configured to convert a digital signal to an analog signal, the digital signal including sequentially inputted digital data, each digital data corresponding to a multi-bit data; a switching circuit configured to select at least one unit element corresponding to a value of the digital data among the unit elements in response to a control signal to switch the digital data; a control circuit configured to apply the control signal to the switching circuit according to a data weight averaging (DWA) algorithm, the DWA algorithm considering whether a reference unit element is selected by the digital data or not and considering a value of the LSB of the digital data; and a summing circuit configured to sum analog signals outputted from the unit elements.

Therefore, the methods of matching dynamic elements using the advanced DWA algorithm and the multi-bit data converter according to the exemplary embodiments of the present invention may pseudo-randomly select the unit elements through a simple algorithm with adaptability for the inputted digital data, thereby reducing the in-band tone caused by selecting a particular unit element repeatedly.

BRIEF DESCRIPTION OF THE DRAWINGS

Exemplary embodiments of the present invention can be understood in more detail from the following descriptions taken in conjunction with the attached drawings, where like elements are represented by like reference numerals, which are given by way of illustration only and thus do not limit the exemplary embodiments of the present invention.

DETAILED DESCRIPTION OF EXEMPLARY EMBODIMENTS

Figure 2:
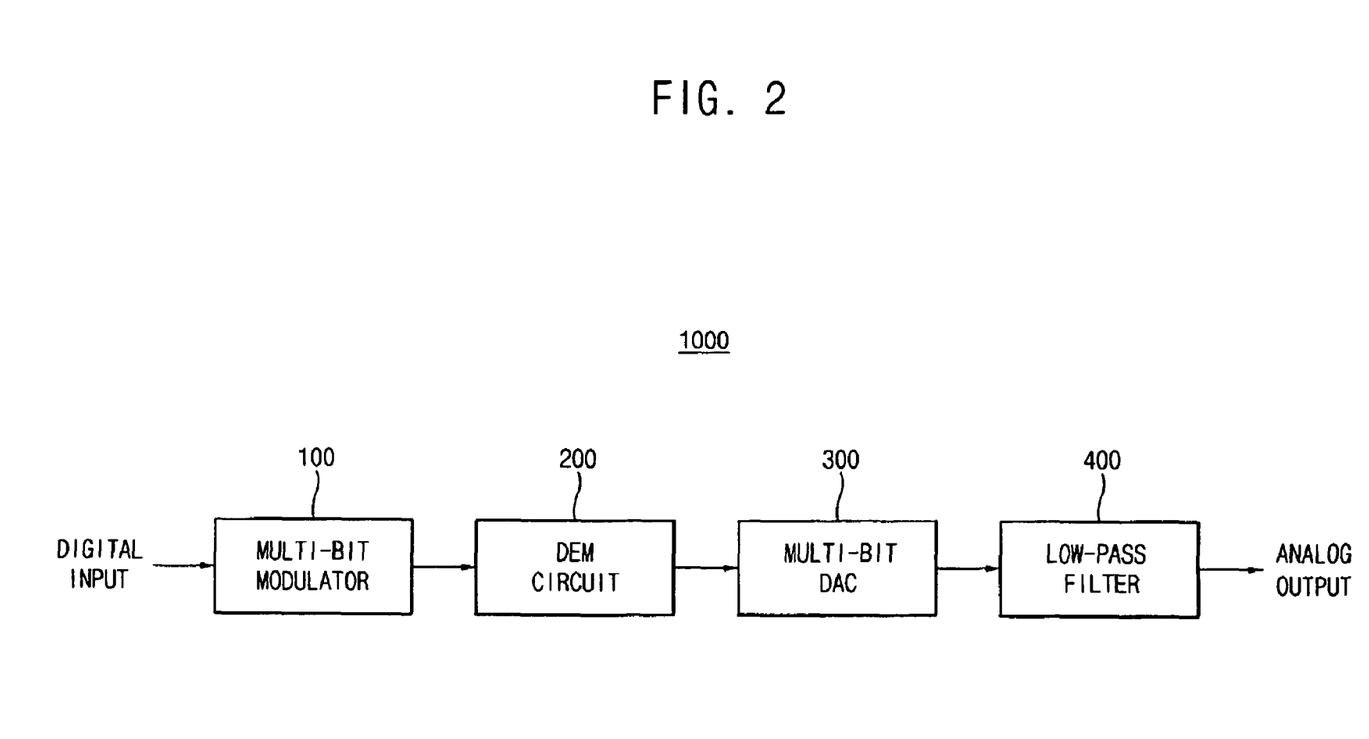
FIG. 2 is a block diagram illustrating a delta-sigma data converter according to an exemplary embodiment of the present invention.

FIG. 2 is a block diagram illustrating a delta-sigma data converter according to an exemplary embodiment of the present invention.

Referring to FIG. 2, the delta-sigma data converter 1000 includes a multi-bit modulator 100, a dynamic element matching (DEM) circuit 200, a multi-bit digital-to-analog converter (DAC) 300 and a low-pass filter 400.

The multi-bit modulator 100 receives a digital signal to perform noise shaping thereon, and then outputs N-bit digital data. The outputted N-bit digital data is switched according to a data weight averaging (DWA) technique in the DEM circuit 200, inputted to unit elements in the multi-bit DAC 300, and then converted into a continuous time signal, that is, an analog signal. The low-pass filter 400 removes an unnecessary band of the analog signals outputted from the multi-bit DAC 300.

Figure 3:
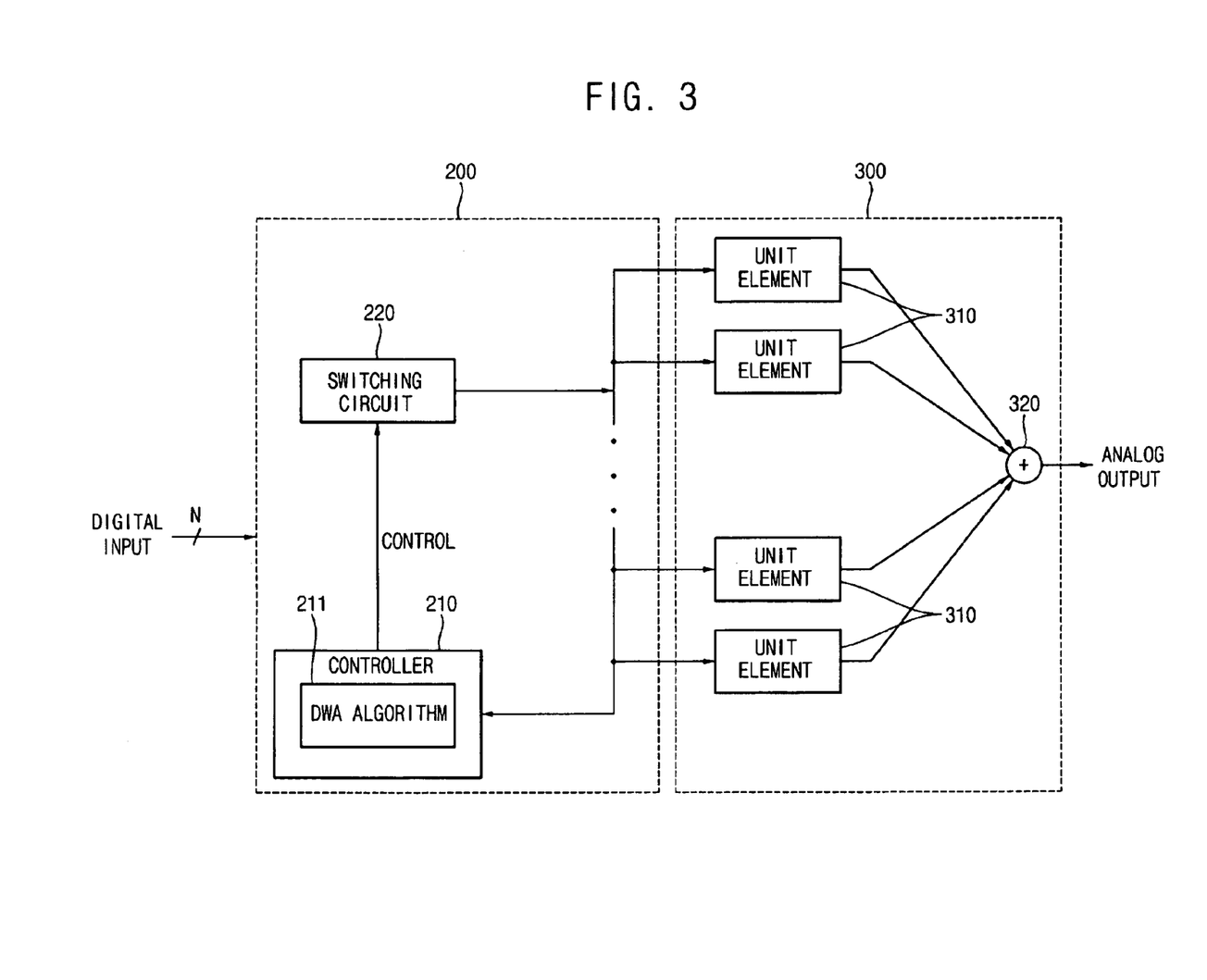
FIG. 3 is a block diagram illustrating the dynamic element matching circuit and the multi-bit DAC of the delta-sigma data converter in FIG. 2 related to dynamic element matching.

FIG. 3 is a block diagram illustrating the DEM circuit 200 and the multi-bit DAC 300 of the delta-sigma data converter 1000 in FIG. 2 related to dynamic element matching.

Referring to FIG. 3, the inputted N-bit digital data is switched by a switching circuit 220 controlled by a DWA algorithm 211 included in a controller 210 of the DEM circuit 200, and then inputted into a plurality of unit elements 310 to be converted into an analog signal.

Each unit element 310 is a circuit that may be used for converting digital data into an analog signal, that is, a current, a charge or a voltage. For example, in a switched capacitor DAC, the unit element may be implemented with a capacitor. Alternatively, a current cell or resistor array may be used.

The analog signals outputted from the unit elements 310 are summed at a summing node 320, and then outputted to the low-pass filter 400, as shown in FIG. 2.

Figure 4:
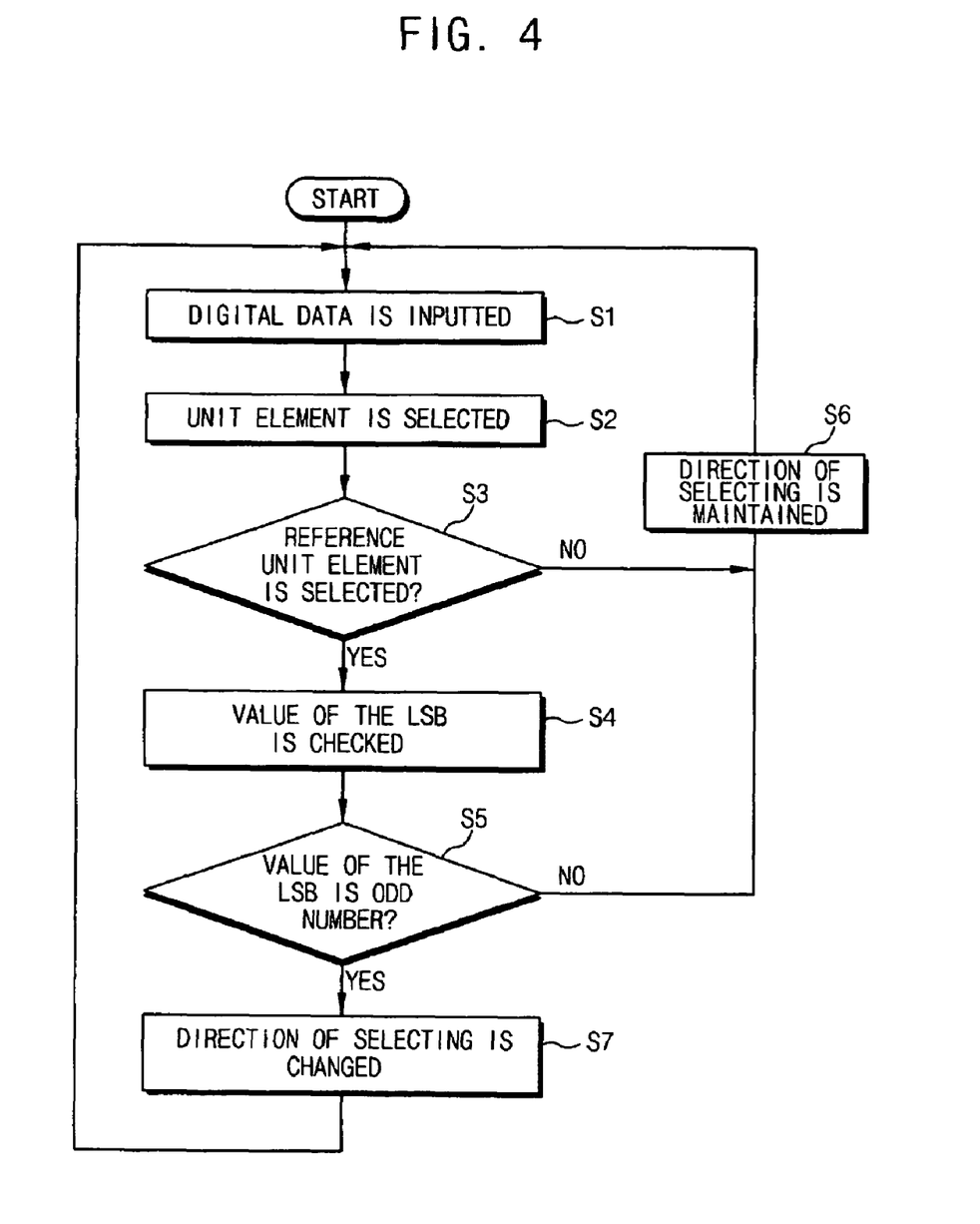
FIG. 4 is a flow chart illustrating a method of matching dynamic elements according to an exemplary embodiment of the present invention.

FIG. 4 is a flow chart illustrating a method of dynamic element matching according to an exemplary embodiment of the present invention.

Referring to FIG. 4, when digital data is inputted (step S1), at least one unit element corresponding to a value of the inputted digital data is selected in a first direction (step S2).

Next, whether a reference unit element is selected or not is determined (step S3). When the reference unit element is selected (step S3: YES), a value of the least significant bit (LSB) of the digital data is checked (step S4).

When the reference unit element is not selected (step S3: NO), at least one unit element corresponding to the next inputted digital data is selected in the first direction without any direction change. That is, the direction of selecting the unit elements is maintained (step S6).

One of the unit elements is set up as the reference unit element. The reference unit element is used as a criterion for changing the direction of selecting the unit elements. A unit element located in a central portion among the M unit elements may be set up as the reference unit element.

Next, the value of the LSB of the digital data is checked (step S4). When the value of the LSB of the digital data is an odd number (step S5: YES), at least one unit element corresponding to a value of the next inputted digital data is selected in a second direction that is opposite to the first direction. That is, the direction of the unit element selection is changed (step S7).

When the value of the LSB of the digital data is not an odd number (step S5: NO), at least one unit element corresponding to the next inputted digital data is selected in the first direction. That is, the direction of the unit element selection is maintained (step S6).

Figure 5:
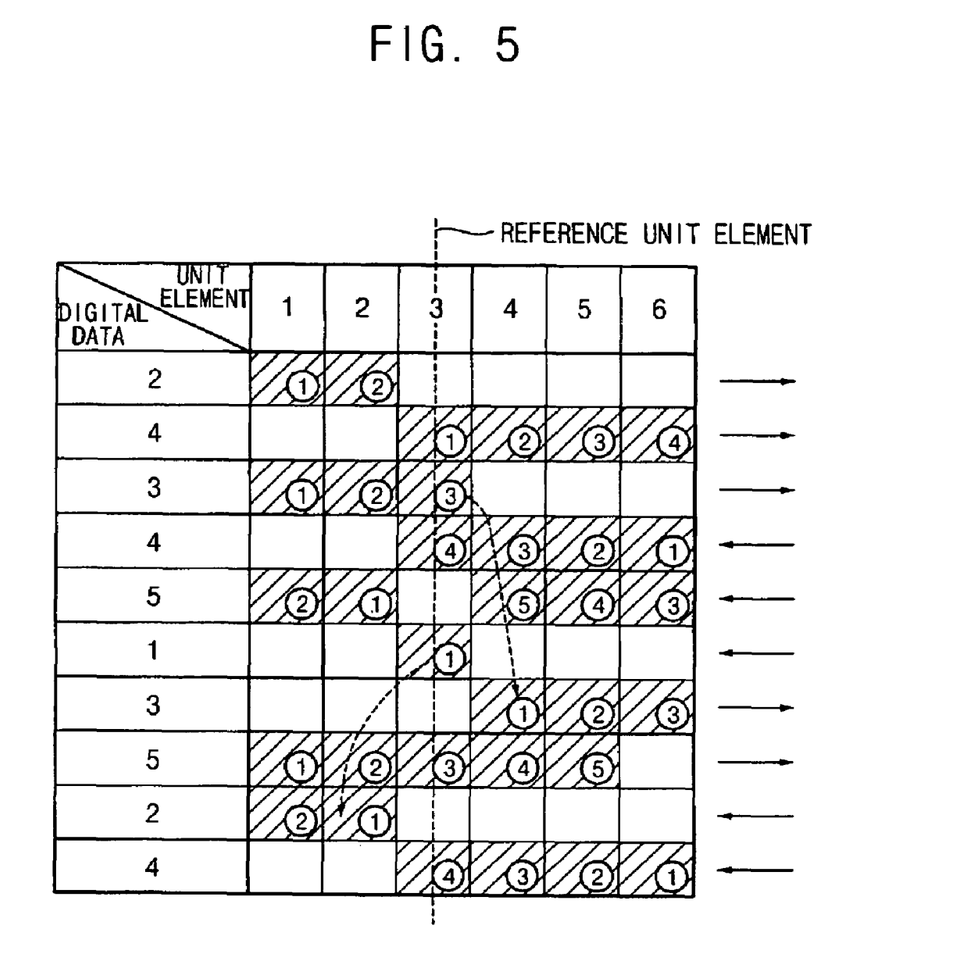
FIG. 5 is a conceptive diagram illustrating the method of matching dynamic elements of FIG. 4.

FIG. 5 is a conceptive diagram illustrating the method of matching dynamic elements of FIG. 4.

Referring to FIG. 5, the DWA algorithm is performed according to the method illustrated in FIG. 4 for switching inputted 3-bit digital data with six unit elements, that is, first through sixth unit elements. The unit elements are considered to be arranged in a circle with respect to a recurring algorithm. That is, the first unit element and sixth unit element are assumed to be adjacent each other.

When digital data 2, that is, '010', is inputted, two unit elements are selected from the first unit element in a right direction (the first direction). That is, the first unit element and the second unit element are sequentially selected in the right direction.

In FIG. 5, the third unit element is set up as the reference unit element. Since the reference unit element, which is used as a criterion for changing the selecting direction, is not selected for the digital data 2, the unit elements corresponding to the next inputted digital data are selected in the first direction.

Therefore, when digital data 4, that is, '100', is inputted, four unit elements are selected in the first direction, from the third unit element to the sixth unit element. The reference unit element that is, the third unit element is selected for the digital data 4.

However, because the LSB of the digital data 4, that is, '0', is not an odd number, the unit elements corresponding to the next inputted digital data are selected also in the same first direction, which in this example is right.

Next, when digital data 3, that is, '011', is inputted, three unit elements are selected from the first unit element to the third unit element in the first direction. The reference unit element, that is, the third unit element is selected for the digital data 3, and the LSB of the digital data 3, that is, '1', is an odd number. Thus, unit elements corresponding to the next inputted digital data are selected in a left direction that is, the second direction opposite to the first direction.

As described above, each of the next inputted digital data, that is, digital data 4, digital data 5 and digital data 1, selects at least one unit element sequentially in the second direction.

Next, since the reference unit element, which in this example is the third unit element, is selected for the digital data 1, and a value of the LSB of the digital data 1 is '1', at least one unit element corresponding to the next inputted digital data is selected in the first direction.

The next inputted digital data 3 selects at least one unit element in the first direction. Because the third unit element was the last unit element that is selected in the first direction, the inputted digital data 3 selects three unit elements, that is, the fourth through the sixth unit elements.

Next digital data 5 selects at least one unit element in the first direction. Because the digital data 5 selects the third unit element, and a value of the LSB is '1', the next inputted digital data selects at least one unit element in the second direction that is opposite to the first direction.

Because the third unit element was the last unit element selected in the second direction, digital data 2 selects two unit elements, that is, the second unit element that is the next unit element following the third unit element, and the first unit element. Next, inputted digital data 4 selects the sixth through third unit elements in the second direction.

As described above, in the exemplary embodiment of the present invention of FIG. 4, digital data are checked in the middle point of a quantization level: In addition, the LSB of the digital data that selects the reference unit element located in a central portion is checked, and then the previous process direction is maintained when the LSB is not an odd number, and the process direction is changed when the LSB is an odd number.

Therefore, a probability that the LSB of the digital data, which selects the reference unit element located in a central portion, is an odd number may be sufficiently random such that the probability may not be determined beforehand. Thus, a starting point is randomly selected during a basic DWA operation, thereby preventing a particular unit element from being repeatedly selected. Therefore, according to the method illustrated in FIG. 3 and FIG. 4, unit elements may be pseudo-randomly selected in sequence through a simple algorithm with adaptability for the inputted digital data.

As described above, the direction of selecting the unit elements may be changed when the LSB of the inputted digital data is an odd number. However, an in-band tone accompanied by the DWA tends to increase as the size of the inputted digital data becomes smaller. In this case, another method is provided in which the direction of selecting the unit elements is changed when the LSB of the inputted digital data is an odd number and the data value is small at the same time. Such a method according to an exemplary embodiment of the present invention will be described with reference to FIG. 6 and FIG. 7.

Figure 6:
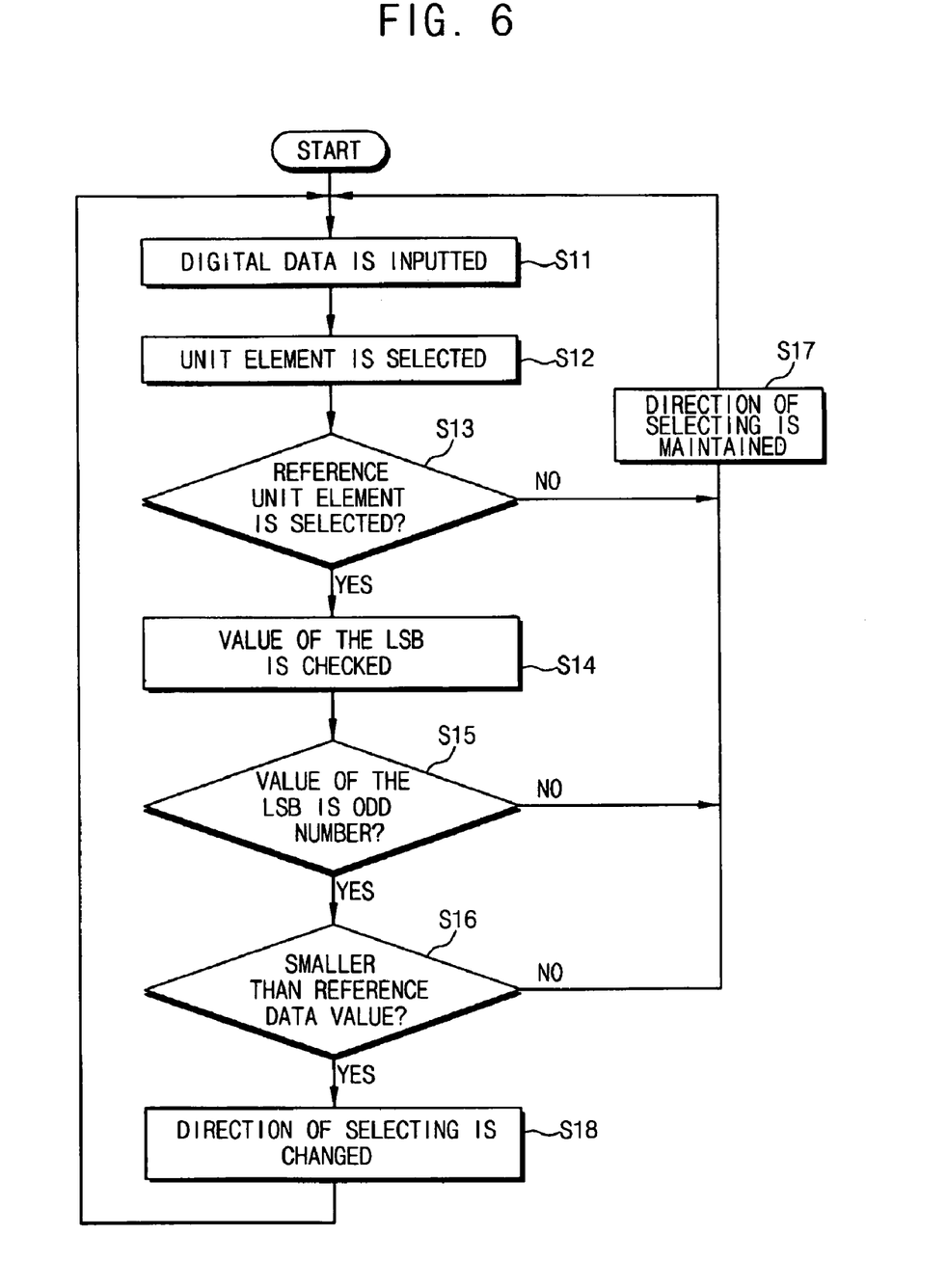
FIG. 6 is a flow chart illustrating a method of matching dynamic elements according to an exemplary embodiment of the present invention.

FIG. 6 is a flow chart illustrating a method of matching dynamic elements according to another example embodiment of the present invention.

Referring to FIG. 6, when digital data is first inputted (step S11), at least one unit element corresponding to a value of corresponding digital data is selected in a first direction (step S12).

Next, whether a reference unit element is selected or not is determined (step S13). When the reference unit element is selected (step S13: YES), a value of the LSB of the digital data is checked (step S14). When the reference unit element is not selected (step S13: NO), at least one unit element corresponding to the next inputted digital data is selected in the first direction. That is, the direction of selecting the unit elements is maintained (step S17).

Next, the value of the LSB of the digital data is checked (step S14). When the value of the LSB of the digital data is an odd number (step S15: YES), the digital data is checked whether the digital data is smaller than a reference data value or not (step S116).

When the digital data is smaller than the reference data value (step S16: YES), at least one unit element corresponding to the next inputted digital data is selected in a second direction that is opposite to the first direction. That is, the direction of selecting the unit element is changed (step S18). When the digital data is not smaller than the reference data value (step S16: NO), the direction is maintained (step S17).

When the value of the LSB of the digital data is not an odd number (step S15: NO), at least one unit element corresponding to the next inputted digital data is selected in the first direction. That is, the direction of selecting the unit elements is maintained (step S17).

The direction may be changed only when the above conditions for a direction change occur Q times. For example, the direction may be changed only when the direction change conditions occur three times. The number Q may be predetermined or may be randomly determined.

Figure 7:
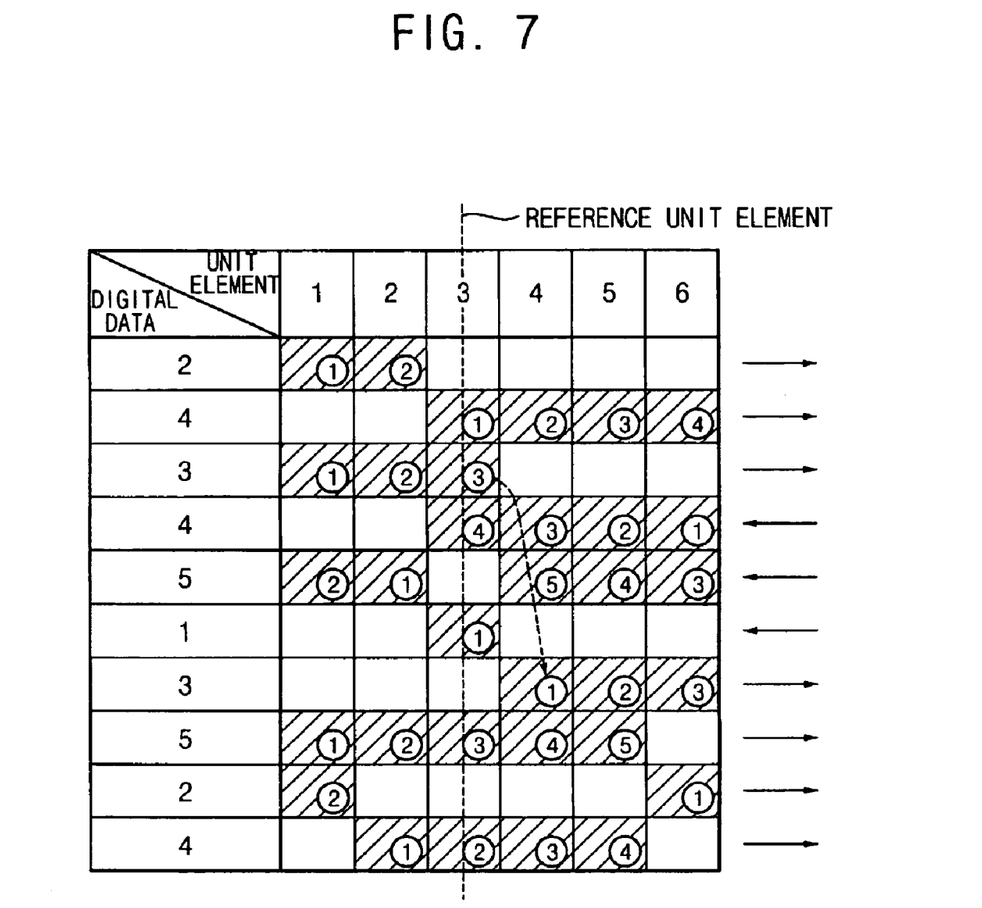
FIG. 7 is a conceptive diagram illustrating the method of matching dynamic elements of FIG. 6.

FIG. 7 is a conceptual diagram illustrating the exemplary method of matching dynamic elements of FIG. 6, where the reference data value is set to 3.

Referring to FIG. 7, the first digital data 2, digital data 4, digital data 3, digital data 4, digital data 5, digital data 1, digital data 3 and digital data 5 respectively select at least one unit element in the same way as described with respect to FIG. 5.

The above digital data 5, which is the last inputted digital data after the digital data 1 and the digital data 3, satisfies the condition for changing the direction of selecting the unit elements according to the embodiment of FIG. 5 since the digital data 5 selects the third unit element and the value of the LSB is '1'. However, the condition for changing the direction according to the exemplary embodiment of FIG. 7 is not satisfied because the digital data 5 is larger than 3, that is, larger than the reference data value.

Therefore, the next inputted digital data 2 does not change the direction and the first direction is maintained.

Alternatively, instead of changing the direction, a selection point for the next inputted digital data may be shifted to the right or left by a predetermined interval whenever the above condition is satisfied. Such a method will be described with reference to FIG. 8.

Figure 8:
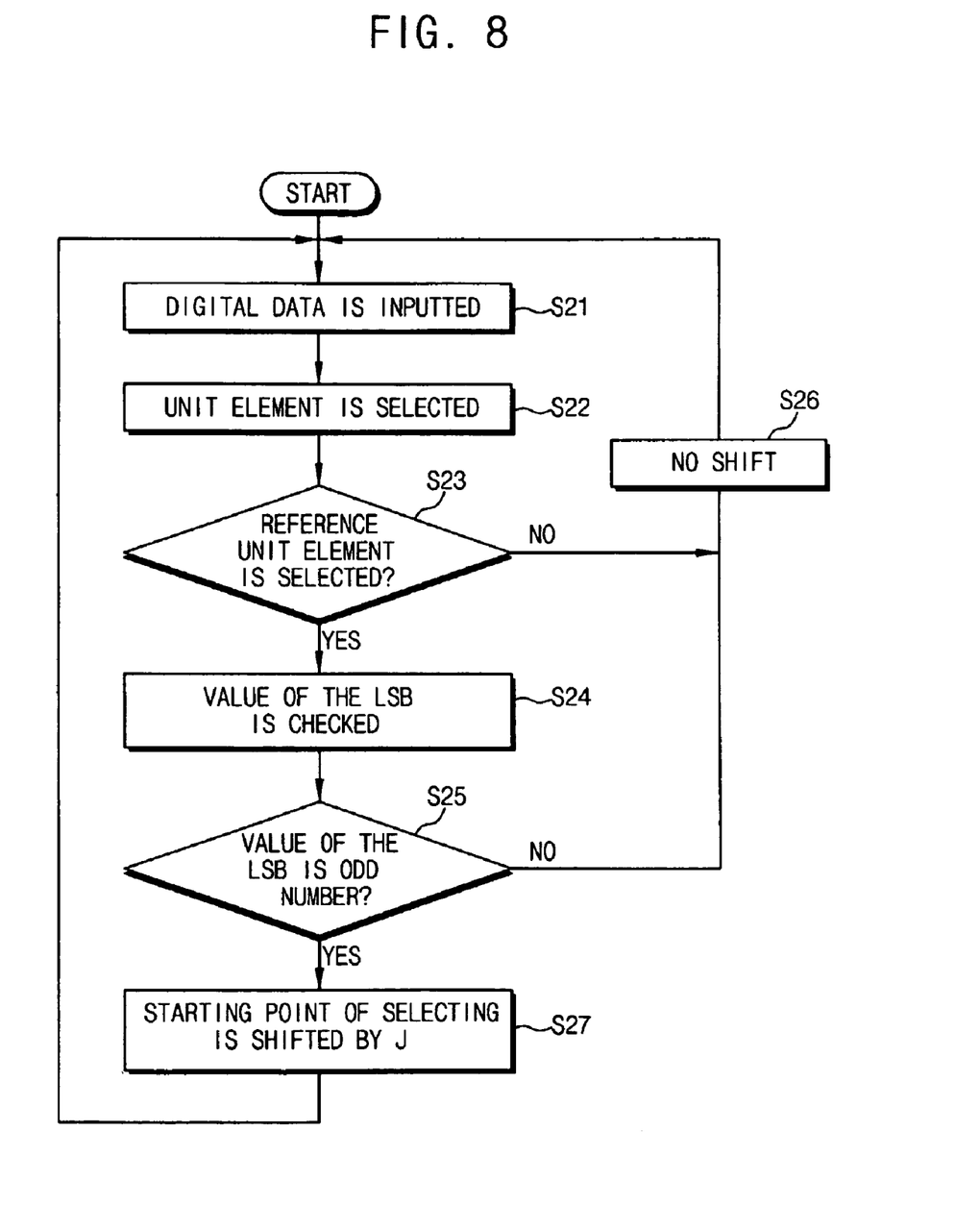
FIG. 8 is a flow chart illustrating a method of matching dynamic elements according to an exemplary embodiment of the present invention.

FIG. 8 is a flow chart illustrating a method of matching dynamic elements according to an exemplary embodiment of the present invention.

Referring to FIG. 8, when digital data is inputted (step S21), at least one unit element corresponding to a value of corresponding digital data is selected in a first direction (step S22).

Next, whether a reference unit element is selected or not is determined (step S23). When the reference unit element is selected (step S23: YES), a value of the LSB of the digital data is checked (step S24).

When the reference unit element is not selected (step S23: NO), the next inputted digital data selects at least one unit element from the next unit element in the first direction without shifting (step S26).

One of the unit elements is set up as the reference unit element. The reference unit element is used as a criterion for changing the direction of selecting the unit elements. A unit element located in a central portion of a quantization level may be set up as the reference unit element.

Next, the value of the LSB of the digital data is checked (step S24). When the value of the LSB of the digital data is an odd number (step S25: YES), the next inputted digital data selects at least one unit element by starting from the unit element that is located to the right or left from the last selected unit element (step S27). That is, the starting point for selecting the unit elements corresponding to the next inputted digital signal is shifted by the number J. The value of the number J may be predetermined.

When the value of the LSB of the digital data is not an odd number (step S25: NO), the next inputted digital data selects at least one unit element starting from the unit element that is next to the last selected unit element without shifting (step S26).

Also, in the embodiment of FIG. 8, the shift condition may include whether the digital data value is smaller than the reference data value or not, as in the exemplary embodiments of FIG. 6 and FIG. 7.

In addition, the starting point may be shifted when the above shifting condition is satisfied Q times, not whenever the shifting condition is satisfied. The number Q may be a predetermined number or a random number.

As described above, the method of matching dynamic elements using advanced DWA algorithm according to exemplary embodiments of the present invention may pseudo-randomly select the unit elements through a simple algorithm with adaptability for the inputted digital data, thereby reducing the in-band tone caused by selecting a particular unit element repeatedly.

Having thus described exemplary embodiments of the present invention, it is to be understood that the invention defined by the appended claims is not to be limited by particular details set forth in the above description as many apparent variations thereof are possible without departing from the spirit or scope thereof as hereinafter claimed.

What is claimed is:

1. A method of matching dynamic elements, the method comprising:
    sequentially selecting at least one first unit element corresponding to a value of first digital data among M unit elements in a first direction, the M unit elements being for converting sequentially inputted digital data to an analog signal;
    checking whether a reference unit element is selected;
    checking a value of a least significant bit (LSB) of the first digital data when the reference unit element is selected;
    sequentially selecting at least one second unit element corresponding to a value of second digital data among the M unit elements in a second direction when the value of the LSB of the first digital data is a first value, the second direction being opposite to the first direction, the second digital data being inputted next to the first digital data; and
    sequentially selecting the at least one second unit element in the first direction when the value of the LSB of the first digital data is a second value.

2. The method of claim 1, wherein the first direction is a right direction and the second direction is a left direction.

3. The method of claim 1, wherein the reference unit element is the unit element that is located in a central portion among the M unit elements.

4. The method of claim 1, further comprising:
    sequentially selecting the at least one second unit element in the first direction when the reference unit element is not selected.

5. The method of claim 1, wherein the first value is an odd number and the second value is an even number.

6. A method of matching dynamic elements, the method comprising:
    sequentially selecting at least one first unit element corresponding to a value of first digital data among M unit elements in a first direction, the M unit elements being for converting sequentially inputted digital data to an analog signal;
    checking whether a reference unit element is selected;
    checking a value of a least significant bit (LSB) of the first digital data when the reference unit element is selected;
    comparing a value of the digital data with a reference data value when the value of the LSB of the first digital data is a first value;
    sequentially selecting at least one second unit element corresponding to a value of second digital data in a second direction when the value of the first digital data is not larger than the reference data value, the second direction being opposite to the first direction, the second digital data being inputted next to the first digital data; and
    sequentially selecting the at least one second unit element in the first direction when the value of the first digital data is larger than the reference data value.

7. The method of claim 6, wherein the first direction is a right direction and the second direction is a left direction.

8. The method of claim 6, wherein the reference data value is about half of a maximum value of the sequentially inputted digital data.

9. The method of claim 6, wherein the reference unit element is the unit element that is located in a central portion among the M unit elements.

10. The method of claim 6, further comprising:
    sequentially selecting the at least one second unit element in the first direction when the reference unit element is not selected.

11. The method of claim 6, further comprising:
    sequentially selecting the at least one second unit element in the first direction when the value of the LSB of the first digital data is a second value.

12. The method of claim 11, wherein the first value is an odd number and the second value is an even number.

13. A method of matching dynamic elements, the method comprising:
    sequentially selecting at least one first unit element corresponding to a value of first digital data among M unit elements in a first direction, the M unit elements being for converting sequentially inputted digital data to an analog signal;
    checking whether a reference unit element is selected;
    checking a value of a least significant bit (LSB) of the first digital data when the reference unit element is selected;
    sequentially selecting at least one second unit element corresponding to a value of second digital data in the first direction by shifting a start point for selecting the at least one second unit element by a predetermined number J when the value of the LSB of the first digital data is a first value, the at least one second unit element being selected starting from the unit element that is shifted by the number J from the unit element last selected by the first digital data; and
    sequentially selecting the at least one second unit element without shifting the start point for selecting the at least one second unit element when the value of the LSB of the first digital data is a second value.

14. The method of claim 13, wherein the first direction is one of a right direction and a left direction.

15. The method of claim 13, wherein the reference unit element is a unit element that is located in a central portion among the M unit elements.

16. The method of claim 13, further comprising:
sequentially selecting the at least one second unit element without shifting the start point for selecting the at least one second unit element when the reference unit element is not selected.

17. The method of claim 13, wherein the first value is an odd number and the second value is an even number.

18. The method of claim 13, wherein the start point is shifted by the number J to the right or to the left.

19. The method of claim 13, wherein sequentially selecting the at least one second unit element by shifting the start point comprises:
comparing the value of the first digital data with a reference data value when the value of the LSB of the first digital data is the first value;
sequentially selecting the at least one second unit element by shifting the start point for selecting the at least one second unit element by the number J when the value of the first digital data is not larger than the reference data value; and
sequentially selecting the at least one second unit element without shifting the start point for selecting the at least one second unit element when the value of the first digital data is larger than the reference data value.

20. The method of claim 19, wherein the reference data value is about half of a maximum value of the sequentially inputted digital data.

21. A multi-bit data converter comprising:
a plurality of unit elements configured to convert a digital signal to an analog signal, the digital signal including sequentially inputted digital data, each digital data corresponding to a multi-bit data;
a switching circuit configured to select at least one unit element corresponding to a value of the digital data among the unit elements in response to a control signal to switch the digital data;
a control circuit configured to apply the control signal into the switching circuit according to a data weight averaging (DWA) algorithm, the DWA algorithm considering whether a reference unit element is selected by the digital data or not and considering a value of the LSB of the digital data; and
a summing circuit configured to sum analog signals outputted from the unit elements.

22. The multi-bit data converter of claim 21, wherein the unit element includes at least one of a capacitor, a current cell and a resistor array.

23. The multi-bit data converter of claim 21, wherein the control circuit is configured to change a direction of selecting the unit element corresponding to the next inputted digital data, by checking whether the reference unit element is selected by the digital data or not and the value of the LSB of the digital data.

24. The multi-bit data converter of claim 23, wherein the control circuit is configured to change the direction of selecting the unit element corresponding to the next inputted digital data when the value of the LSB of the digital data is a first value.

25. The multi-bit data converter of claim 24, wherein the first value is an odd number.

26. The multi-bit data converter of claim 23, wherein the control circuit is configured to change the direction of selecting the unit element corresponding to the next inputted digital data, only when the value of the LSB of the digital data is a first value and the value of the digital data is not larger than a reference data value.

27. The multi-bit data converter of claim 23, wherein the control circuit is configured to change the direction of selecting the unit element corresponding to the next inputted digital data, when a condition for changing the direction is satisfied Q times, wherein Q is a predetermined number, the condition being satisfied when the reference unit element is selected by the digital data and the value of the LSB of the digital data is a first value.

* * * * *